United States Patent [19]

Tsuzuki

[11] 4,389,728

[45] Jun. 21, 1983

[54] FREQUENCY DIVIDER

[75] Inventor: Akira Tsuzuki, Tokorozawa, Japan

[73] Assignee: Citizen Watch Co., Ltd., Tokyo, Japan

[21] Appl. No.: 219,237

[22] Filed: Dec. 23, 1980

[30] Foreign Application Priority Data

Dec. 29, 1979 [JP] Japan .................................. 54-172181

[51] Int. Cl.³ ...................... H03K 21/10; H03K 23/22
[52] U.S. Cl. .................................. 377/114; 377/117; 377/121
[58] Field of Search ...................... 307/225 R, 225 C; 377/114, 117, 121

[56] References Cited

U.S. PATENT DOCUMENTS

| | | | |
|---|---|---|---|
| 3,619,644 | 11/1971 | Vittoz | 307/225 C |
| 3,749,937 | 7/1973 | Rogers | 307/225 |
| 3,973,139 | 8/1976 | Dingwell | 307/225 C |
| 4,063,114 | 12/1977 | Morozumi | 307/225 |
| 4,068,137 | 1/1978 | Vittoz | 307/225 C |

Primary Examiner—John S. Heyman
Attorney, Agent, or Firm—Bernard, Rothwell & Brown

[57] ABSTRACT

A frequency divider for electric timepieces or the like comprising a first block composed of even clock controlled inverters connected in cascade, a second block composed of even clock controlled inverters connected cascade and a clock controlled signal compounding circuit. The final stage output terminal of the first block is connected to a second input terminal of the clock controlled signal compounding circuit.

4 Claims, 9 Drawing Figures

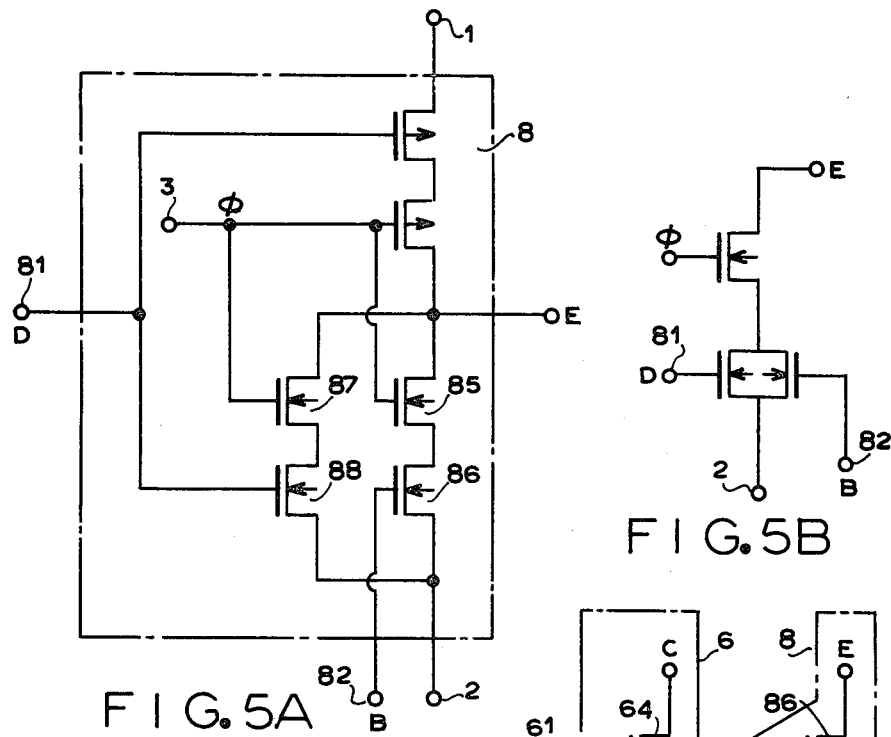
FIG. 5A
FIG. 5B
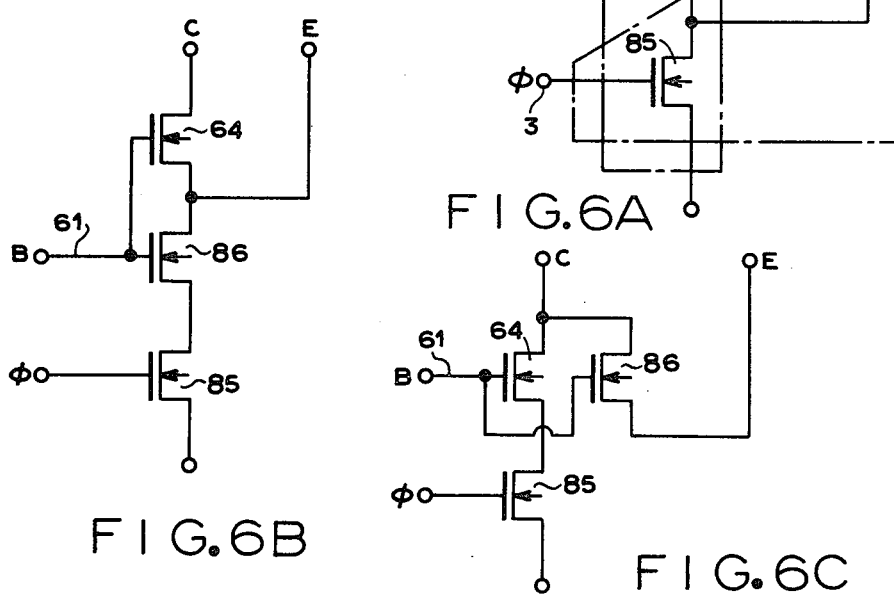
FIG. 6B
FIG. 6A
FIG. 6C 4,389,728

FREQUENCY DIVIDER

BACKGROUND OF THE INVENTION

1. Field of the Invention

This invention relates to a dynamic frequency divider having an even division ratio.

2. Description of the Prior Art

A frequency divider for electronic timepieces or the like is required to consume small current. When the frequency is high, it is preferable to use a dynamic frequency divider rather than a static frequency divider. In order to decrease the electric power to be consumed, use is made of an electric source voltage which is as low as possible. In this case, even though the high speed operation property of the frequency divider is deteriorated, the frequency dividing operation thereof must be effected in a reliable manner. Concerning the division ratio, a first stage frequency divider directly connected to an oscillator directly receives the output from the oscillator as a clock signal and a gate capacity supplied with the clock signal is operative as one portion of an oscillator circuit. As a result, the charging and discharging electric power of the gate capacity is fed back to the oscillator without consuming it, so that it is advantageous to make the division ratio of the first stage frequency divider more or less large. It is desirable to obtain a division ratio which is 1 to the radical number of 2 for the purpose of bringing the division ratio into agreement with the number of oscillations of a standard quartz oscillator.

In order to attain such object, a frequency divider for dividing the frequency of an applied alternating input signal by an odd integer greater than unity has heretofore been proposed. But, such conventional frequency divider has the disadvantage that use must be made of a quartz oscillator which can produce a special number of oscillations. Another frequency divider for dividing the frequency of an applied alternating input signal by 4 has also been proposed. But, such frequency divider has the drawback that the retardation time of a gate causes the operation to disturb, so that such frequency divider is unsuitable for a low electric source voltage.

SUMMARY OF THE INVENTION

An object of the invention, therefore, is to provide a frequency divider which can eliminate the above mentioned drawbacks which have been encountered with the prior art techniques, and which can satisfactorily operate with the aid of a low electric source voltage and a clock signal having a small voltage amplitude.

A feature of the invention is the provision of a frequency divider comprising a first block composed of even clock controlled inverters connected in cascade and operative to propagate the conditional change of an input signal in synchronism with the change of a clock signal from high to low; a second block composed of even clock controlled inverters connected in cascade and operative to propagate the conditional change of at least input signal from a first electric source line potential to a second electric source line potential in synchronism with the change of the clock signal; and a clock controlled signal compounding circuit operative to change the output condition in synchronism with the change of the clock signal when the condition of the first input terminal is changed from the first electric source line potential to a second electric source line potential and when the condition of the second input terminal is changed from the second electric source line potential to the first electric source line potential; the final stage output terminal of the first block being connected to the initial stage input terminal of the second block and to the second input terminal of the clock controlled signal compounding circuit, the final stage output terminal of the second block being connected to said first input terminal and the output terminal of said signal compounding circuit being connected to the initial stage input terminal of the first block.

Further objects and features of the invention will be fully understood from the following detailed description with reference to the accompanying drawings.

BRIEF DESCRIPTION OF THE DRAWINGS

FIGS. 5A, 5B and 6A–6C are diagrammatic views of other various embodiments of a frequency divider circuit according to the invention.

DETAILED DESCRIPTION OF THE PREFERRED EMBODIMENT

Figure 3:
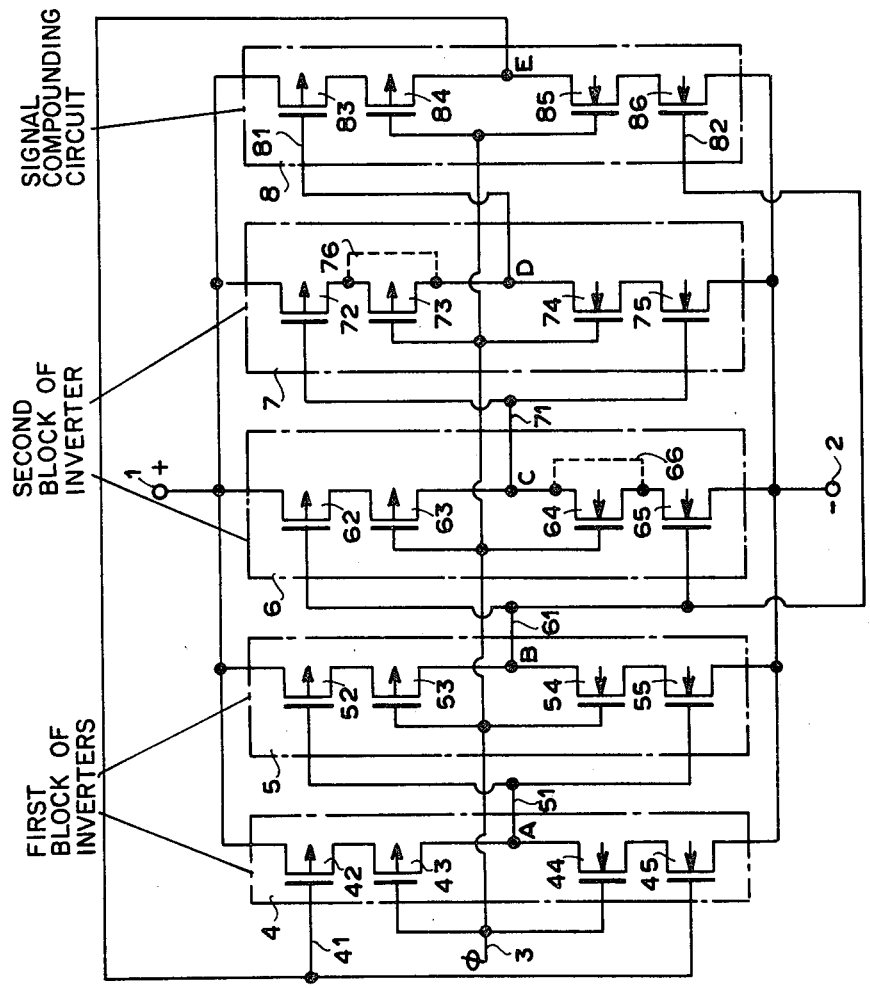
FIG. 3 is a diagrammatic view of one embodiment of a frequency divider circuit according to the invention.

FIG. 3 shows a circuit arrangement of one embodiment of a frequency divider according to the invention.

Figure 4:
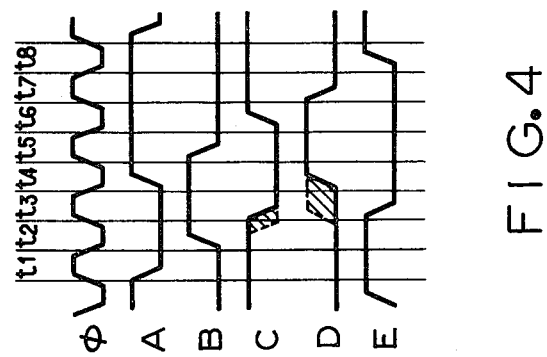
FIG. 4 is a graph illustrating voltage wave forms at respective output terminals of the circuit shown in FIG. 3.

FIG. 4 shows voltage wave forms at respective output terminals of the circuit shown in FIG. 3. In FIG. 3, reference numeral 1 designates a first electric source line and 2 a second electric source line. Between these two electric source lines is applied a voltage. Reference numeral 3 shows a clock signal line for supplying an input signal to the frequency divider as a whole. Reference numerals 4 and 5 illustrate first clock controlled inverters for constituting a first block and composed of field effect transistors 43, 53 each having a first channel type, that is, a P channel type as shown in FIG. 3 and a gate connected to the clock signal line 3, field effect transistors 42, 52 each having a P channel type as shown in FIG. 3 and a gate connected to input terminals 41, 51, field effect transistors 44, 54 each having a second channel type, that is, an n channel type as shown in FIG. 3 and a gate connected to the clock signal line 3 and field effect transistors 45, 55 each having an n channel type as shown in FIG. 3 and a gate connected to the input terminals 41, 51, the field effect transistors 42, 43 being connected in series between the first electric source line 1 and the output terminal A, the field effect transistors 52, 53 being connected in series between the first electric source line 1 and the output terminal B, the field effect transistors 44, 45 being connected in series between the second electric source line 2 and the output terminal A and the field effect transistors 54, 55 being connected in series between the second electric source line 2 and the output terminal B.

Reference numeral 6 designates a second clock controlled inverter and 7 a third clock controlled inverter. These second and third inverters 6, 7 constitute a second block. The second and third inverters 6, 7 are provided with input terminals 61, 71 and output terminals C, D, respectively. The second inverter 6 is composed of field effect transistors 62 to 65, while the third inverter 7 is composed of field effect transistors 72 to 75. Each of these second and third inverters 6, 7 is the same in construction as the first clock controlled inverter 4. In the second inverter 6, the field effect transistor 64 may be excluded and connection may be made as shown by dotted lines 66. In the third inverter 7, the field effect transistor 73 may be excluded and connection may be made as shown by dotted lines 76.

Reference numeral 8 designates a clock controlled signal compounding circuit composed of a field effect transistor 84 having a first channel type and a gate connected to the clock signal line 3, a field effect transistor 83 having a first channel type and a gate connected to the first input terminal 81, a field effect transistor 85 having a second channel type and a gate connected to the clock signal line 3 and a field effect transistor 86 having a second channel type and a gate connected to the second input terminal 82. The field effect transistors 83, 84 are connected in series between the first electric source line 1 and the output terminal E, while the field effect transistors 85, 86 are connected in series between the second electric source line 2 and the output terminal E.

The above mentioned first clock controlled inverters 4 and 5 are connected in cascade and the final stage output terminal B thereof is connected to the input terminal 61 of the second inverter 6 and to the second input terminal 82 of the signal compounding circuit 8. The output terminal C of the second inverter 6 is connected to the input terminal 71 of the third inverter 7 and the output terminal D of the third inverter 7 is connected to the first input terminal 81 of the signal compounding circuit 8 whose output terminal E is connected to the initial stage input terminal 41 of the above mentioned first inverters 4, 5 connected in series, thereby closing a ring circuit.

The frequency divider constructed as above described functions to divide a clock signal applied to the clock signal line 3 by 4 and produce at respective output terminals A, B, C, D, E the divided output clock signals.

The frequency divider constructed as above described will operate as follows.

FIG. 4 shows the wave forms of the voltages produced at respective output terminals A, B, C, D, E when a high potential is applied to the first electric source line 1, a low potential is applied to the second electric source line 2 and a series of pulses shown by $\phi$ are applied to the clock signal line 3. At the beginning of a time zone $t_1$, the output terminals A, C, E are high in potential. If the clock $\phi$ is changed from a low potential to a high potential, the field effect transistors 44, 45 become ON at the same time and the potential of the output terminal A is changed from high to low. As a result, the field effect transistors 54, 55, 74, 73 become ON at the same time. The output terminals B, D are low in potential, and these output terminals are not subjected to potential change. In circuits from the other electric source line to respective output terminals thereof, either one of the field effect transistors is ON, and as a result, no electric charge is moved at the output terminals C, E. The electric charge accumulated on the capacity parasitic to the wiring and gate portion functions to hold the previous electric potential.

In the time zone $t_2$, the field effect transistors 52, 53 become ON at the same time so as to change the potential at the output terminal B from low to high.

The operation of the frequency divider shown in FIG. 3 and including the field effect transistors 64 and 73 will now be described. FIG. 4 illustrates such operation by full line wave forms. In the time zone $t_3$, the field effect transistors 64, 65 and field effect transistors 85, 86 become ON at the same time so as to change the potential condition of the output terminals C and E from high to low.

In the time zone $t_4$, the field effect transistors 42, 43 and field effect transistors 72, 73 become ON at the same time so as to change the potential condition of the terminals A and D from low to high.

In the time zone $t_5$, the field effect transistors 54, 55 become ON at the same time so as to change the potential condition of the output terminal B from high to low.

In this way, in the time zone $t_6$ the potential condition of the output terminal C is changed from low to high, in the time zone $t_7$ the potential condition of the output terminal D is changed from high to low and in the time zone $t_8$ the potential condition of the output terminal E is changed from low to high.

The potential condition of each of the output terminals completes its one cycle during one period from the time zone $t_1$ to the time zone $t_8$. The potential condition in the previous half time zones $t_2$ and $t_3$ is propagated from the output terminal B to the output terminal E by skipping over two output terminals, thereby dividing the clock signal applied to the clock signal line 3 by 4 and producing at respective output terminals A, B, C, D, E the divided output clock signals.

The above mentioned operation is effected at each stage in synchronism with the clock signal $\phi$ so that the frequency divider as a whole is reliable in operation so long as the operation at each stage is reliable. This feature makes the frequency divider according to the invention superior to the conventional frequency divider. Contrary to the conventional frequency divider shown in FIG. 1, the accumulation of the gate retardation does not make the frequency divider unreliable in operation. In addition, it is possible to obtain complete two phase clock outputs from the output terminals D and E.

Figure 2:
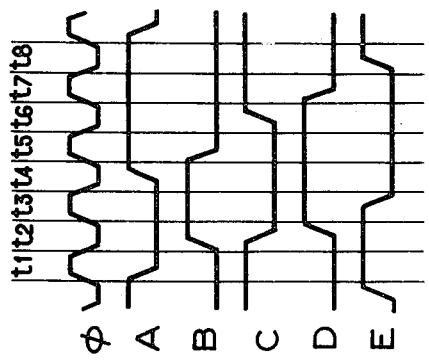
FIG. 2 is a graph illustrating voltage wave forms at respective output terminals of the circuit shown in FIG. 1.
Figure 1:
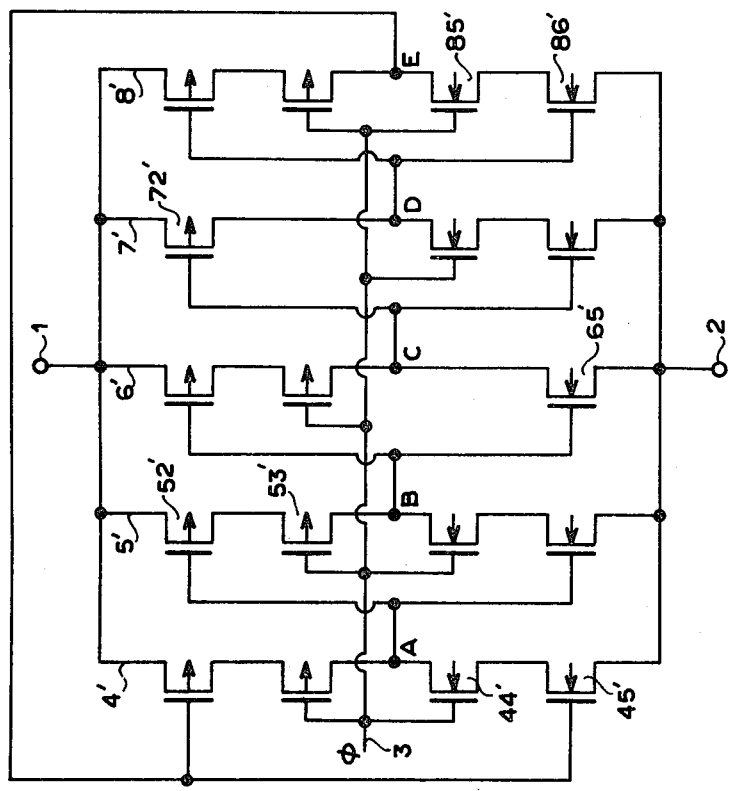
FIG. 1 is a diagrammatic view of a conventional frequency divider circuit.

The operation of the conventional frequency divider shown in FIG. 1 will now be described with reference to the voltage wave forms shown in FIG. 2.

In the time zone $t_1$, field effect transistors 44', 45' become ON at the same time so as to change the potential condition of the output terminal A from high to low.

In the time zone $t_2$, field effect transistor 52', 53' become ON at the same time so as to change the potential condition of the output terminal B from low to high.

If the output terminal B becomes high in potential, a field effect transistor 65' becomes ON so that the potential condition of the output terminal C is changed from high to low, thereby making a field effect transistor 72' ON. As a result, the potential condition of the output terminal D is changed from low to high.

Next, in the time zone $t_3$, the output terminal D is high in potential, so that field effect transistors become ON at the same time so as to change the potential condition of the output terminal E from high to low.

If the electric supply voltage is low, it takes a much time to reverse the potential condition of the inverters 5', 6', 7'. As a result, in the time zone $t_2$, the potential condition of the output terminal D is not changed from low to high and in the time zone $t_3$ the clock pulse could not change the potential condition of the inverter 8'. Accumulation of such inverter retardation time results in an erroneous operation of the frequency divider.

In order to eliminate such drawback, in the frequency divider according to the invention the potential condition of the signal compounding circuit 8 is changed from high to low by means of the output signal from the inverter 5 instead of the output signal from the inverter 7.

In the frequency divider according to the invention, if the field effect transistors 64, 73 are excluded and direct connections are made as shown by dotted lines 66, 76, the voltage wave forms produced at the output terminals C and D are displaced toward the time at which the propagation of the signal is earlier than the normal operational time as shown by dotted lines in FIG. 4. As a result, the absence of the field effect transistors 64, 73 does not cause any erroneous operation of the frequency divider according to the invention. There is a large margin of the gate retardation time as shown by hatched regions in FIG. 4.

FIG. 5A shows another embodiment of a signal compounding circuit 8 shown in FIG. 3. In the present embodiment, the signal compounding circuit 8 shown in FIG. 3 further comprises a series circuit composed of a field effect transistor 87 having a gate connected to the clock signal line and a field effect transistor 88 having a gate connected to the first input terminal 81. The use of such measure ensures a maintenance of the ON condition of the field effect transistor 88 even if the field effect transistor 86 becomes OFF and provides the important advantage that it is possible to reduce the danger of changing the potential at the output terminal E due to the leak current and hence reduce the lowest operative frequency of the frequency divider.

FIG. 5B shows a further embodiment of a signal compounding circuit 8 shown in FIG. 3. In the present embodiment, the field effect transistor 85 and the field effect transistor 87 shown in FIG. 5A are used in common as shown in FIG. 5B. In addition, the field effect transistor 87 may be omitted if the second inverter 6 shown in FIG. 3 includes the field effect transistor 64.

FIGS. 6A, 6B and 6C show various embodiments in which the field effect transistor 85 and the field effect transistor 64 of the second inverter 6 are used in common for both the second inverter 6 and the signal compounding circuit 8.

FIG. 5B and FIGS. 6A, 6B and 6C show the second channel type field effect transistors only, but the first channel type field effect transistor portions are the same as those shown in FIG. 3. In addition, to the circuits shown in FIGS. 6A, 6B and 6C may be added the parallel circuit inclusive of the field effect transistor shown in FIG. 5A.

In the above description, the first channel type is of the P channel type, but the first channel type may be the n channel type. Any side of the two field effect transistors connected between respective output terminals and the electric source line may be connected to the output terminal or to the electric source line.

In addition, the field effect transistor may be replaced by another switching element whose node has a capacity which is comparable with that of the gate current.

In the embodiment shown in FIG. 3, two of the first inverters 4, 5 are connected in cascade so as to divide the frequency of the applied alternating input signal by 4. Alternatively, 2n of the first inverters where n is an integer may be connected in cascade so as to constitute the first block and 2m of the inverter 6 or 7 where m is also an integer may be connected in cascade with each other so as to constitute the second block, thereby obtaining a frequency divider which can divide the frequency of the applied alternating input signal by (2n+m+1).

More particularly, let n=1 and m=1, then it is possible to obtain a frequency divider which can divide the frequency of the applied alternating input signal by 4. Let n=3 and m=1, then it is possible to obtain a frequency divider which can divide the frequency of the applied alternating input signal by 8. Let n=7 and m=1, then it is possible to obtain a frequency divider which can divide the frequency of the applied alternating input signal by 16.

What is claimed is:

1. A frequency divider comprising a first block composed of an even number of stages of clock controlled inverters connected in cascade and operative to propagate the change of state of an input signal in synchronism with the change of a clock signal; a second block composed of an even number of stages of clock controlled inverters connected in cascade and operative to propagate the change of state of the input signal from a first electric source line potential to a second electric source line potential in synchronism with the change of the clock signal; and a clock controlled signal compounding circuit having first and second input terminals operative to change the output state in synchronism with the change of the clock signal when the state of the first input terminal is changed from the first electric source line potential to the second electric source line potential and when the state of the second input terminal is changed from the second electric source line potential to the first electric source line potential; the final stage output terminal of the first block being connected to the initial stage input terminal of the second block and to the second input terminal of said clock controlled signal compounding circuit, the final stage output terminal of the second block being connected to said first input terminal; and the output terminal of said signal compounding circuit being connected to the initial input terminal of the first block.

2. The frequency divider according to claim 1, wherein said first block is composed of a first group of odd order of stages of a clock controlled inverter and a second group of even order of stages of a clock controlled inverter, each stage of said clock controlled inverters of said first block is composed of a transistor having a first channel type and a gate connected to the clock signal line and a transistor having a first channel type and a gate connected to the input terminal of that stage of said first block, said transistors being connected in series between said first electric source line and the output terminal of that stage of said first block, a transistor having a second channel type and a gate connected to the clock signal line and a transistor having a second channel type and a gate connected to said input terminal of that stage of said first block, said transistors being connected in series between the second electric source line and said output terminal of that stage of said first block; that stage of said first group is composed of a transistor having a first channel type and a gate connected to the clock signal line and a transistor having a first channel type and a gate connected to the input terminal of that stage of said first block, said transistors being connected in series between the first electric source line and the output terminal of that stage of said first group and a circuit inclusive of at least a transistor having a second channel type and a gate connected to the input terminal of that stage of said first block and connected between the second electric source line and said output terminal of that stage of said first group; that stage of said second group is composed of a circuit inclusive of at least a transistor having a first channel type and a gate connected to the input terminal of that stage of said first group, a transistor having a second channel type and a gate connected to the clock signal line and a transistor having a second channel type and a gate connected to the input terminal of that stage of said first group, said transistors being connected in series between the second electric source line and the output terminal of that stage of said second group; and said signal compounding circuit is composed of a transistor having a first channel type and a gate connected to the clock signal line and a transistor having a first channel type and a gate connected to the input terminal of said signal compounding circuit, said transistors being connected in series between the first electric source line and the output terminal of said signal compounding circuit, a transistor having a second channel type and a gate connected to the clock signal line and a transistor having a second channel type and a gate connected to said input terminal of said signal compounding circuit, said transistors being connected in series between the second electric source line and said output terminal of said signal compounding circuit.

3. The frequency divider according to claim 2, wherein said clock controlled signal compounding circuit further comprises a series circuit composed of a field effect transistor having a gate connected to the clock signal line and a field effect transistor having a gate connected to said output terminal of said first block.

4. The frequency divider according to claim 1, wherein said first block is composed of an even number of stages of the first clock controlled inverters connected in cascade, said second block is composed of a second clock controlled inverter and a third clock controlled inverter connected in cascade; a first stage of said first clock controlled inverters is composed of a transistor having a first channel type and a gate connected to the clock signal line and a transistor having a first channel type and a gate connected to the input terminal of said first clock controlled inverters, said transistors being connected in series between said first electric source line and the output terminal of said first stage; a transistor having a second channel type and a gate connected to the clock signal line and a transistor having a second channel type and a gate connected to said input terminal of said first clock controlled inverters, said transistors being connected in series between the second electric source line and said output terminal; a second stage of said first clock controlled inverters is composed of a transistor having a first channel type and a gate connected to the clock signal line and a transistor having a first channel type and a gate connected to said output terminal of said first stage, said transistors being connected in series between said first electric source line and the output terminal of said second stage, a transistor having a second channel type and a gate connected to the clock signal line and a transistor having a second channel type and a gate connected to said output terminal of said first stage, said transistors being connected in series between said second electric source line and said output terminal of said second stage; the second clock controlled inverter is composed of a transistor having a first channel type and a gate connected to the clock signal line and a transistor having a first channel type and a gate connected to said output terminal of said second stage, said transistors being connected in series between the first electric source line and the output terminal of said second clock controlled inverter, and a circuit inclusive of at least a transistor having a second channel type and a gate connected to said output terminal of said second stage and connected between the second electric source line and output terminal of said second clock controlled inverter; the third clock controlled inverter is composed of a circuit inclusive of at least a transistor having a first channel type and a gate connected to the output terminal of said second clock controlled inverter and connected between the first electric source line and the output terminal of said third clock controlled inverter, a transistor having a second channel type and a gate connected to the clock signal line and a transistor having a second channel type and a gate connected to the output terminal of said second clock controlled inverter, said transistors being connected in series between the second electric source line and said output terminal of said third clock controlled inverter;. and said signal compounding circuit is composed of the transistor having a first channel type and a gate connected to the clock signal line and a transistor having a first channel type and a gate connected to said output terminal of said third clock controlled inverter, said transistors being connected in series between the first electric source line and the output terminal of said signal compounding circuit, a transistor having a second channel type and a gate connected to the clock signal line and a transistor having a second channel type and a gate connected to said output terminal of said second stage, said transistors being connected in series between the second electric source line and said output terminal of said signal compounding circuit.

* * * * *